United States Patent
Shen et al.

(10) Patent No.: US 7,262,999 B2
(45) Date of Patent: Aug. 28, 2007

(54) SYSTEM AND METHOD FOR PREVENTING READ MARGIN DEGRADATION FOR A MEMORY ARRAY

(75) Inventors: Jian-Yuan Shen, Hsinchu (TW); Hsien-Wen Hsu, Hsinchu (TW); Chi-Ling Chu, Hsinchu (TW)

(73) Assignee: Macronix International Co., Ltd. (TW)

( * ) Notice: Subject to any disclaimer, the term of this patent is extended or adjusted under 35 U.S.C. 154(b) by 81 days.

(21) Appl. No.: 10/997,114

(22) Filed: Nov. 24, 2004

(65) Prior Publication Data

US 2006/0109718 A1     May 25, 2006

(51) Int. Cl.
  *G11C 16/06*  (2006.01)
  *G11C 16/04*  (2006.01)
(52) U.S. Cl. ............................ 365/185.2; 365/185.21; 365/185.22; 365/185.24; 365/185.28; 365/185.29
(58) Field of Classification Search ............ 365/185.2, 365/185.29
See application file for complete search history.

(56) References Cited

U.S. PATENT DOCUMENTS

| | | | |
|---|---|---|---|
| 6,307,784 B1 * | 10/2001 | Hamilton et al. ...... | 365/185.22 |
| 6,643,177 B1 | 11/2003 | Le et al. | |
| 6,690,602 B1 * | 2/2004 | Le et al. ................ | 365/185.33 |
| 6,711,062 B1 * | 3/2004 | Chou ...................... | 365/185.2 |
| 6,760,267 B2 * | 7/2004 | Chevallier et al. ......... | 365/210 |
| 6,954,379 B2 * | 10/2005 | Chou ...................... | 365/185.2 |
| 2003/0161188 A1 * | 8/2003 | Takahashi et al. ...... | 365/189.07 |
| 2005/0117444 A1 * | 6/2005 | Maayan et al. ............. | 365/232 |

* cited by examiner

*Primary Examiner*—Amir Zarabian
*Assistant Examiner*—Ly Duy Pham
(74) *Attorney, Agent, or Firm*—Martine Penilla & Gencarella, LLP

(57) ABSTRACT

An ultra cycling nitride read only memory (NROM) device is coupled to a NROM array such that both bits of the ultra cycling NROM device will be erased when all NROM devices of the NROM array are erased. The ultra cycling NROM device is then programmed at its right bit. A threshold voltage difference will be obtained for the ultra cycling NROM device for the un-programmed left bit. Next, a cycling number is obtained based on the threshold voltage difference for the ultra cycling NROM device. A threshold voltage shift can be found based on the cycling number for the NROM array. Finally, an erase voltage will be calculated according to the threshold voltage shift for the NROM array. If the NROM array is programmed again, the erase voltage will be applied to un-programmed NROM devices of the NROM array to further reduce the threshold voltages.

9 Claims, 6 Drawing Sheets

LL = Low Vt Distribution Low Bond

LH = Low Vt Distribution High Bond

SYSTEM AND METHOD FOR PREVENTING READ MARGIN DEGRADATION FOR A MEMORY ARRAY

BACKGROUND OF THE INVENTION

1. Field of the Invention

The present invention relates generally to a flash memory device, and more particularly, to a system and a method for preventing read margin degradation for a nitride read only memory array.

2. Description of the Related Art

Nitride Read Only Memory (NROM) devices are widely used in the semiconductor industry. As is well known in the art, a NROM device stores charges at both ends of a composite oxide-nitride-oxide (ONO) layer, thus being capable of two bits operation. When a bit of the NROM device is programmed with a charge, the threshold voltage for that bit of the NROM device will be increased. A programmed bit of the NROM device represents a logic "0," while an un-programmed or erased bit of the NROM device represents a logic "1." The charge stored at one bit of the NROM device will affect the threshold voltage of the other bit, which is the second bit effect of the NROM device.

The charge retention ability of a NROM device is affected by both the cycling numbers and the aging of the NROM device. A cycling of a NROM device includes a program operation and an erase operation. As the number of cyclings for a NROM device increases, the ONO layer of the NROM device will suffer damage, thus resulting in charge losses and the decrease of the threshold voltage for the NROM device. The aging of a NROM device contributes to the charge loss as well. Therefore, the aging of a NROM device will also decrease its threshold voltage.

FIG. 1 shows the threshold voltage Vt distributions for a NROM array 100 after 10,000 cyclings and 150° C. baking for 20 hours. The high Vt distribution 110 represents the threshold voltage distribution of the NROM array 100 at a programmed state after 10,000 cyclings, whereas the low Vt distribution 130 represents the threshold voltage distribution of the NROM array 100 at an erased state after 10,000 cyclings. Each distribution has its high bond and low bond. The threshold voltage difference between the high Vt distribution 110 at its low bond and the low Vt distribution 130 at its high bond forms the read margin 150, which is the read margin for the NROM array 100 after 10,000 cyclings. No aging effect is considered for the high Vt distribution 110 and the low Vt distribution 130 of the NROM array 100.

In order to demonstrate the aging effect for the NROM array 100, after 10,000 cyclings, the NROM array 100 is baked at 150° C. for 20 hours, which is equivalent to the aging of the NROM array 100 at 25° C. for ten years. The high Vt distribution 120 represents the threshold voltage distribution for the NROM array 100 at a programmed state after 150° C. baking for 20 hours and 10,000 cyclings, whereas the low Vt distribution 140 represents the threshold voltage distribution for the NROM array 100 at an erased state after 150° C. baking for 20 hours and 10,000 cyclings. As shown, the threshold voltages of the NROM array at both the programmed state and the erase state are decreased due to the aging effect. The threshold voltage difference between the low bonds of the high Vt distributions 110 and 120 is $\Delta PV$, while the threshold voltage difference between the high bonds of the low Vt distributions 130 and 140 is $\Delta EV$. The threshold voltage difference between the high Vt distribution 120 at its low bond and the low Vt distribution 140 at its high bond forms the read margin 160, which is the degraded read margin for the NROM array 100 after the aging effect and 10,000 cyclings.

As indicated in FIG. 1, the read margin 160 is much narrower than the read margin 150 due to the aging effect. A narrow read margin could cause errors in a read operation for the NROM array 100. As shown, $\Delta PV$, i.e., the decrease of the threshold voltage of the NROM array 100 at a programmed state after the NROM array 100 is affected by the aging, is the cause for the read margin degradation for the NROM array 100.

In view of the foregoing, there is a need for a system and a method that can prevent read margin degradation for a NROM array that is affected by the aging.

SUMMARY OF THE INVENTION

Broadly speaking, the present invention fills this need by providing a method for a nitride read only memory (NROM) array to overcome the read margin degradation problem after the NROM array is affected by aging. A system for utilizing this method is also disclosed.

In accordance with one aspect of the present invention, a system for preventing read margin degradation is provided. The system includes an ultra cycling NROM device and a NROM array. The ultra cycling NROM device is coupled to the NROM array such that both bits of the ultra cycling NROM device are erased when all the NROM devices of the NROM array are erased. The ultra cycling NROM device is identical to all the NROM devices of the NROM array. In one embodiment, both bits of the ultra cycling NROM device are erased concurrently with the NROM array.

In accordance with another aspect of the present invention, a method for preventing read margin degradation for a NROM array that is affected by aging is described. First of all, all the NROM devices of the NROM array along with both bits of the ultra cycling NROM device are erased. A first current is measured for the first bit of the ultra cycling NROM device. Next, the second bit of the ultra cycling NROM device is programmed. A second current is measured for the first bit of the ultra cycling NROM device. First and second threshold voltages are obtained based on the first current and second current for the ultra cycling NROM device. Because of the second bit effect, there exists a threshold voltage difference between the first and second threshold voltages. A cycling number is found based on the threshold voltage difference for the ultra cycling NROM device. Since the NROM array and the ultra cycling NROM device have the same cycling number, a threshold voltage shift for the NROM array is found based on the cycling number. An erase voltage is calculated based on the threshold voltage shift for the NROM array. When the NROM array is programmed, the calculated erase voltage will be applied to the un-programmed NROM devices of the NROM array to reduce the threshold voltages of the NROM array at an erased state.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
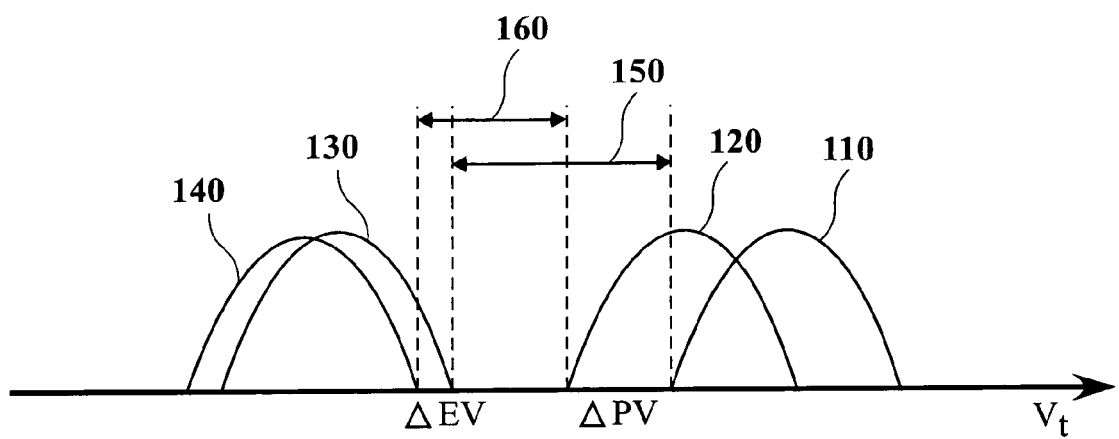
FIG. 1 illustrates threshold voltage Vt distributions for a nitride read only memory (NROM) array after 10,000 cyclings and 150° C. baking for 20 hours.
Figure 2A:
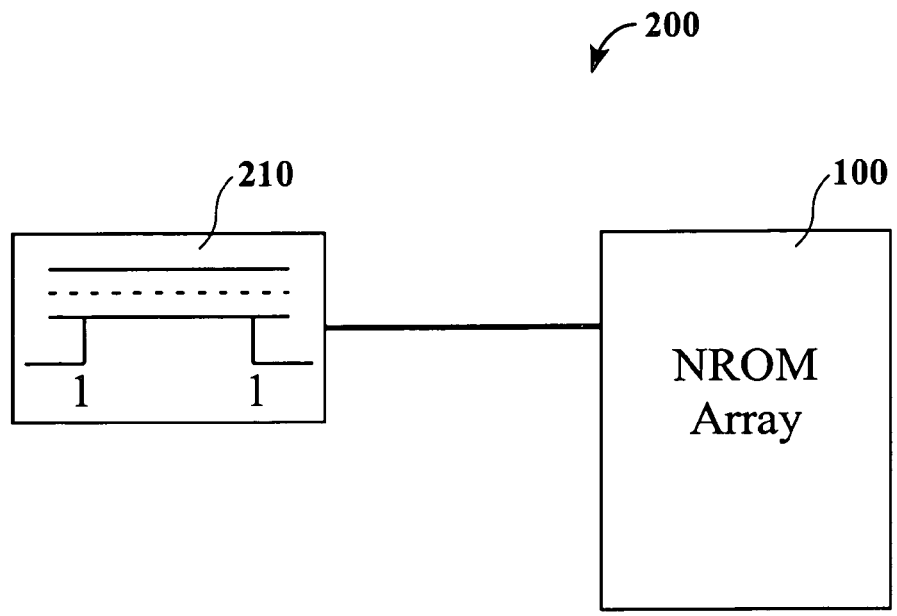
FIGS. 2(a)-(c) illustrate a system for preventing read margin degradation for a NROM array that is affected by aging in accordance with one embodiment of the present invention.
Figure 2B:
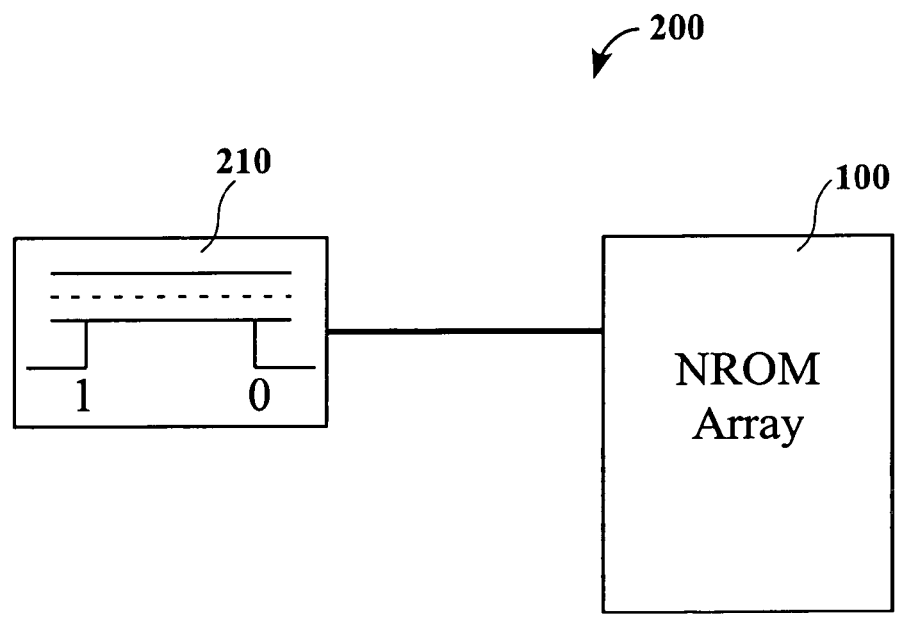
Figure 2C:
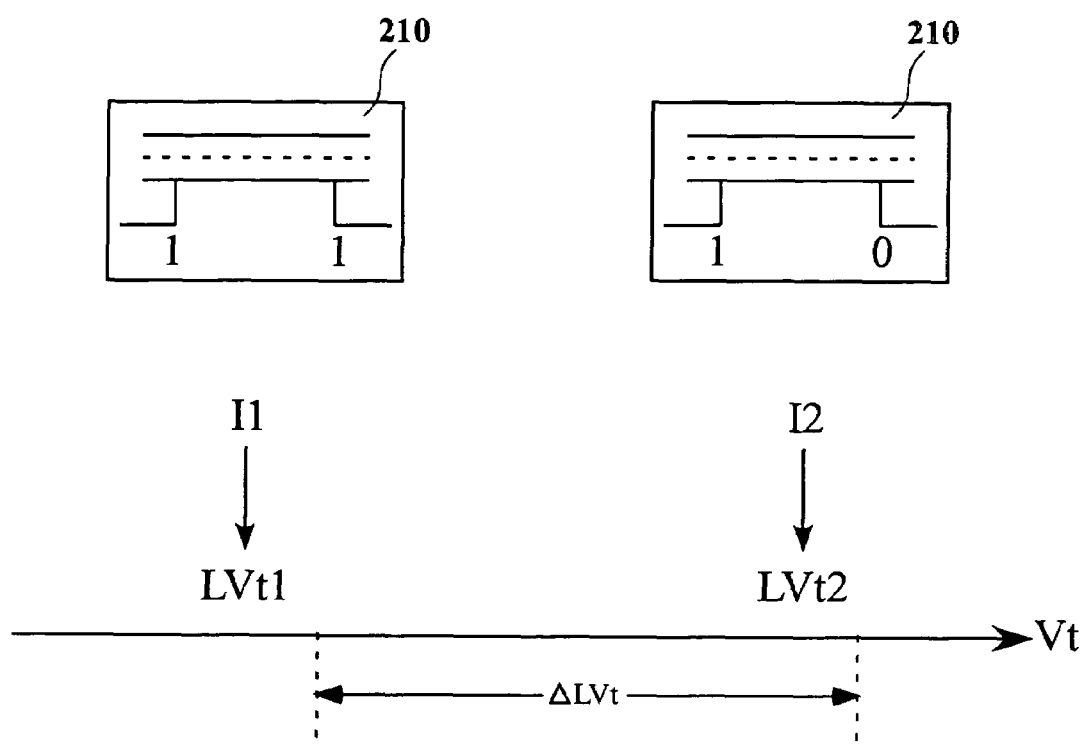

FIGS. 2(a)-(c) demonstrate a system 200 for preventing read margin degradation for a NROM array 100 in accordance with one embodiment of the present invention. As shown, the system 200 includes a NROM array 100 and an ultra cycling NROM device 210. The NROM array 100 comprises a plurality of NROM devices, while the ultra cycling NROM device 210 is capable of storing charges at both its right bit and its left bit. The ultra cycling NROM device 210 is identical to the NROM devices of the NROM array 100. The ultra cycling NROM device 210 is coupled to the NROM array 100 such that the ultra cycling NROM device 210 will have the same cycling number as the NROM array 100, i.e., both bits of the ultra cycling NROM device 210 will be erased if all the NROM devices of the NROM array 100 are erased.

As shown in FIG. 2(a), the NROM array 100 and both bits of the ultra cycling NROM device 210 are erased concurrently. The "1" and "1" for both bits of the ultra cycling NROM device 210 represent both erased bits of the ultra cycling NROM device 210. Then, a current for the left bit of the ultra cycling NROM device 210 is measured and recorded as I1.

Next, the right bit of the ultra cycling NROM device 210 is programmed. As indicated in FIG. 2(b), the programmed right bit of the ultra cycling NROM device 210 is represented by "0." The current for the left bit of the ultra cycling NROM device 210 is measured again and recorded as I2. Because of the second bit effect, there exists a difference between I1 and I2.

FIG. 2(c) shows that threshold voltages LVt1 and LVt2 of the ultra cycling NROM device 210 correspond with I1 and I2 of the ultra cycling NROM device 210, respectively. The threshold voltage difference ΔLVt between the threshold voltages LVt1 and LVt2 will be used to define a threshold voltage shift ΔPV for the NROM array 100 at an erased state.

Figure 3:
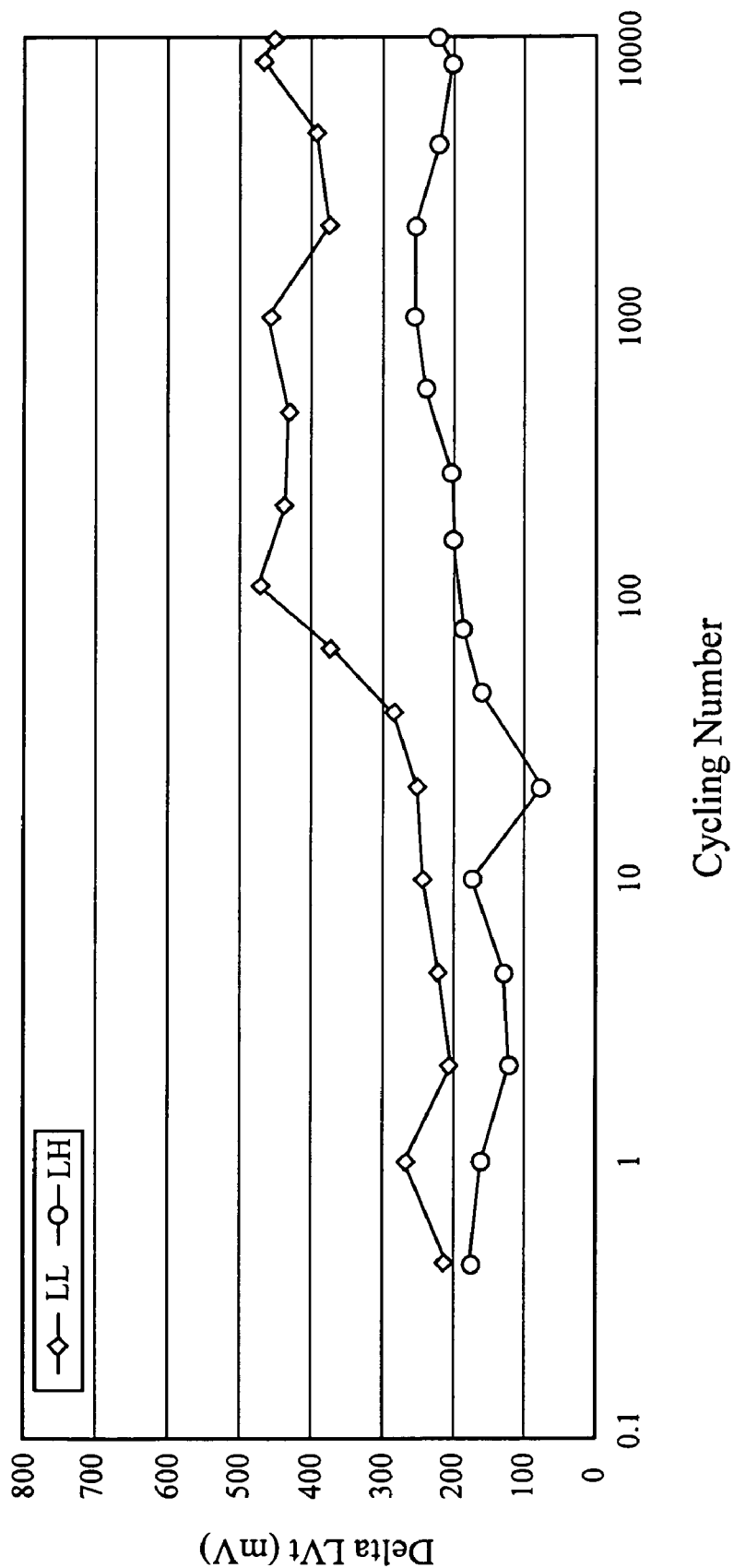
FIG. 3 is an exemplary diagram that shows the relationship between the cycling number and the threshold voltage difference ΔLVt for an ultra cycling NROM device in accordance with one embodiment of the present invention.

FIG. 3 shows an exemplary diagram that illustrates the relationship between the threshold voltage difference ΔLVt and the cycling number for the ultra cycling NROM device 210 in accordance with one embodiment of the present invention. As shown, the threshold voltage difference ΔLVt will increase as the cycling number increases. Therefore, a cycling number can be estimated based on the threshold voltage difference ΔLVt of the ultra cycling NROM device 210 obtained from the steps in FIGS. 2(a)-(c). Because the ultra cycling NROM device 210 has the same cycling number as the NROM array 100, the estimated cycling number for the ultra cycling NROM device 210 is also the cycling number of the NROM array 100.

Figure 4:
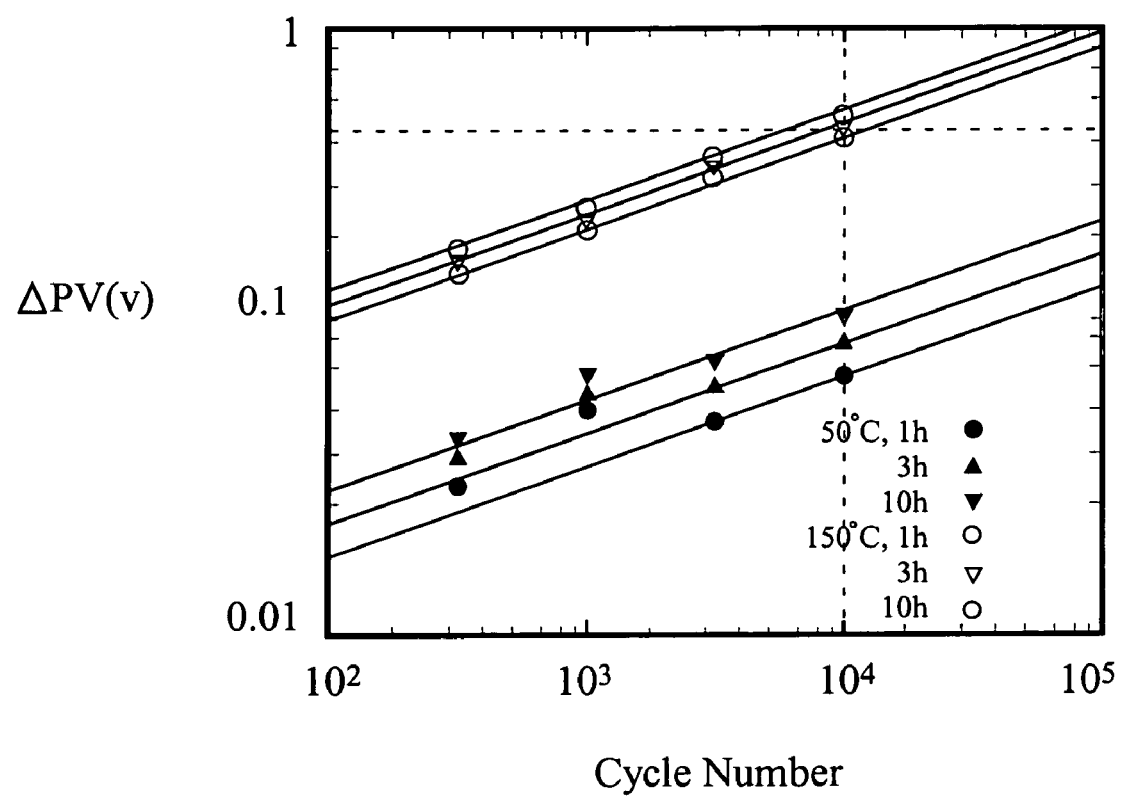
FIG. 4 is an exemplary diagram that shows the relationship between the cycling number and the threshold voltage shift ΔPV for a NROM array with different baking temperatures and baking times in accordance with one embodiment of the present invention.

FIG. 4 shows an exemplary diagram that illustrates the relationship between the threshold voltage shift ΔPV and the cycling number for the NROM array 100 with different baking temperatures and baking time in accordance with one embodiment of the present invention. Using the estimated cycling number obtained from the step in FIG. 3, one can find the corresponding threshold voltage shift ΔPV for the NROM array 100 from this diagram.

Figure 5:
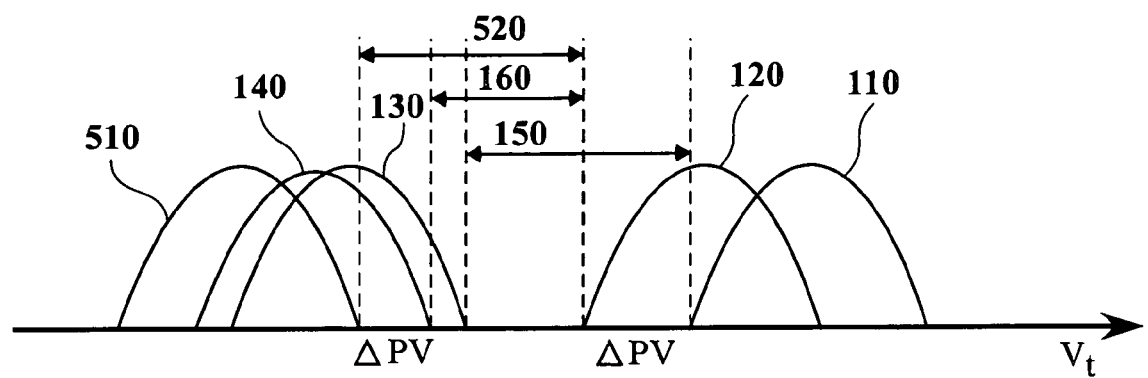
FIG. 5 illustrates threshold voltage Vt distributions for a NROM array after 10,000 cyclings and 150° C. baking for 20 hours in accordance with one embodiment of the present invention.

FIG. 5 shows the threshold voltage Vt distributions of the NROM array 100 after 10,000 cyclings and 150° C. baking for 20 hours in accordance with one embodiment of the present invention. The 150° C. baking for 20 hours for the NROM array 100 is equivalent to the aging of the NROM array 100 at 25° C. for 10 years. In order to improve the read margin 160 after the NROM array 100 is affected by aging, the low Vt distribution 140 needs to be shifted to the left (to a lower threshold voltage region) to form the low Vt distribution 510 such that the threshold voltage difference between the low Vt distributions 140 and 510 at their high bonds is as much as ΔPV.

To achieve the low Vt distribution shift for the NROM array 100, an erase voltage is calculated based on the threshold voltage shift ΔPV obtained from the step in FIG. 4. After the NROM array is programmed, the erase voltage will be applied to the un-programmed NROM devices of the NROM array 100 to further reduce the threshold voltages of the un-programmed NROM devices of the NROM array 100. As shown, the read margin 520 between the low bond of the high Vt distribution 120 and the high bond of the low Vt distribution 510 is much larger than the read margin 160 between low bond of the high Vt distribution 120 and the high bond of the low Vt distribution 140. As a result, the read margin between the programmed state and the erased state of the NROM array 100 is improved.

Overall, a system and an exemplary method for preventing read margin degradation for a NROM array 100 that is affected by aging are disclosed. The system includes a NROM array 100 and an ultra cycling NROM device 210. The ultra cycling NROM device 210 is coupled to the NROM array 100 such that the ultra cycling NROM device 210 will have the same cycling number as the NROM array 100. Whenever all the NROM devices of the NROM array 100 are erased, both bits of the ultra cycling NROM device 210 will be erased. After the both bits of the ultra cycling NROM device 210 along with the NROM array are erased, the ultra cycling NROM device 210 is programmed at its right bit. A threshold voltage difference ΔLVt will be obtained for the ultra cycling NROM device 210. Then, a cycling number is obtained based on the threshold voltage difference ΔLVt for the ultra cycling NROM device 210. Since the ultra cycling NROM device 210 has the same cycling number as the NROM array 100, a threshold voltage shift ΔPV for the NROM array 100 can be found based on the obtained cycling number. Finally, an erase voltage will be calculated according to the threshold voltage shift ΔPV for the NROM array 100. When the NROM array 100 is programmed again, an erase operation will be performed for the un-programmed NROM devices of the NROM array 100 by applying the calculated erase voltage to the un-programmed NROM devices of the NROM array 100.

The foregoing descriptions of specific embodiments of the invention have been presented for purposes of illustration and description. They are not intended to be exhaustive or to limit the invention to the precise forms disclosed. Obviously, many modifications and variations are possible in light of the above teachings. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A method for preventing read margin degradation for a memory array that is coupled to an ultra cycling memory device such that a first bit and a second bit of the ultra cycling memory device will be erased whenever all of memory devices of the memory array are erased, comprising:
    erasing the first bit and the second bit of the ultra cycling memory device when all of the memory devices of the memory array are erased;
    measuring a first current for the first bit of the ultra cycling memory device;
    programming the second bit of the ultra cycling memory device;
    measuring a second current for the first bit of the ultra cycling memory device;
    obtaining a first threshold voltage corresponding to the first current for the ultra cycling memory device;
    obtaining a second threshold voltage corresponding to the second current for the ultra cycling memory device;
    obtaining a threshold voltage difference between the first threshold voltage and the second threshold voltage;
    finding a cycling number based on the threshold voltage difference for the ultra cycling memory device;
    finding a threshold voltage shift based on the cycling number for the memory array;
    calculating an erase voltage based on the threshold voltage shift for the memory array; and
    erasing un-programmed memory devices of the memory array to reduce threshold voltages of the un-programmed memory devices of the memory array to a same extent as the threshold voltage shift after the memory array is programmed.

2. The method for preventing read margin degradation for a memory array as recited in claim 1, wherein finding the cycling number is performed by obtaining the cycling number from a diagram that shows a relationship between the cycling number and the threshold voltage difference for the ultra cycling memory device.

3. The method for preventing read margin degradation for a memory array as recited in claim 2, wherein the diagram shows a relationship between the cycling number and the threshold voltage difference for the ultra cycling memory device at an erased state.

4. The method for preventing read margin degradation for a memory array as recited in claim 1, wherein finding the threshold voltage shift is performed by obtaining the threshold voltage shift from a diagram that shows a relationship between the cycling number and the threshold voltage shift for the memory array.

5. The method for preventing read margin degradation for a memory array as recited in claim 4, wherein the diagram shows a relationship between the cycling number and the threshold voltage shift for the memory away at different baking temperatures and baking time.

6. The method for preventing read margin degradation for a memory array as recited in claim 1, wherein the ultra cycling memory device is a nitride read only memory device.

7. The method for preventing read margin degradation for a memory array as recited in claim 1, wherein the memory array is a nitride read only memory (NROM) array.

8. The method for preventing read margin degradation for a memory array as recited in claim 1, wherein the ultra cycling memory device is identical to all of the memory devices of the memory array.

9. The method for preventing read margin degradation for a memory array as recited in claim 7, wherein the first bit and the second bit of the ultra cycling memory device are erased concurrently with all of the memory devices of the NROM array.

* * * * *